United States Patent
Schwann et al.

(10) Patent No.: US 7,404,153 B2
(45) Date of Patent: Jul. 22, 2008

(54) METHOD FOR THE PROVIDING OF A DESIGN, TEST AND DEVELOPMENT ENVIRONMENT AND SYSTEM FOR CARRYING OUT SAID METHOD

(75) Inventors: Paul Schwann, Dresden (DE); Matthias Weiss, Dresden (DE)

(73) Assignee: Phillips Semiconductors Dresden AG, Dresden (DE)

( * ) Notice: Subject to any disclaimer, the term of this patent is extended or adjusted under 35 U.S.C. 154(b) by 137 days.

(21) Appl. No.: 10/503,909

(22) PCT Filed: Feb. 7, 2003

(86) PCT No.: PCT/DE03/00361

§ 371 (c)(1),
(2), (4) Date: Feb. 11, 2005

(87) PCT Pub. No.: WO03/067476

PCT Pub. Date: Aug. 14, 2003

(65) Prior Publication Data

US 2005/0132307 A1    Jun. 16, 2005

(30) Foreign Application Priority Data

Feb. 8, 2002   (DE) ................................. 102 05 523

(51) Int. Cl.
*G06F 17/50* (2006.01)
(52) U.S. Cl. .......................................................... 716/1
(58) Field of Classification Search ...................... 716/1
See application file for complete search history.

(56) References Cited

U.S. PATENT DOCUMENTS

| | | | | |
|---|---|---|---|---|
| 5,619,665 | A * | 4/1997 | Emma | 712/208 |
| 5,761,740 | A * | 6/1998 | Johnson et al. | 711/202 |
| 6,658,458 | B1 * | 12/2003 | Gai et al. | 709/215 |
| 7,065,633 | B1 * | 6/2006 | Yates et al. | 712/227 |
| 2003/0009453 | A1 * | 1/2003 | Basso et al. | 707/3 |
| 2003/0140337 | A1 * | 7/2003 | Aubury | 717/158 |
| 2003/0225998 | A1 * | 12/2003 | Khan et al. | 712/210 |
| 2004/0111595 | A1 * | 6/2004 | Klein | 712/300 |
| 2004/0268348 | A1 * | 12/2004 | Waki et al. | 718/1 |
| 2005/0086451 | A1 * | 4/2005 | Yates et al. | 712/32 |
| 2005/0175005 | A1 * | 8/2005 | Brown | 370/389 |
| 2006/0031661 | A1 * | 2/2006 | Takayama et al. | 712/205 |
| 2006/0101369 | A1 * | 5/2006 | Wang et al. | 716/17 |

* cited by examiner

*Primary Examiner*—Jack Chiang
*Assistant Examiner*—Suchin Parihar
(74) *Attorney, Agent, or Firm*—Baker Botts L.L.P.

(57) ABSTRACT

In order to improve the functionality of a computer-assisted design, test and/or development environment for a data processing circuit arrangement, the instructions of the circuit arrangement are stored in a machine-readable manner in a data base with the binary representations thereof. The allocation of a predefined binary representation (instruction code) to an instruction occurs in a modifiable manner. In this way, processors can be developed which are specialized and optimized in terms of processing specific software applications. The invention also relates to a computer-assisted design, test and/or circuit environment corresponding the above-mentioned method.

14 Claims, 2 Drawing Sheets

| Name | # | ARG | Action | Instruction Code | | | Bit Length |
|---|---|---|---|---|---|---|---|
| ADD | 2 | RA, RB | ALU=#1 + #2 | \|ADD-Opcode\|RA-code\|RB-code\| | | | 20 |
| SUB | 2 | RA, RB RC, c# | ALU=#1 − #2 | \|SUB1-Opcode\|RC-code\|RB-code\| | | | 20 |
| | | | | \|SUB2-Opcode\|RA-code\|c#-code\| | | | 24 |
| | | | | \|SUB3-Opcode\|c#-code\|RA-code\| | | | 24 |

METHOD FOR THE PROVIDING OF A DESIGN, TEST AND DEVELOPMENT ENVIRONMENT AND SYSTEM FOR CARRYING OUT SAID METHOD

CROSS-REFERENCE TO RELATED APPLICATIONS

The present application claims priority to German Patent Application No. 102 05 523.8, filed Feb. 8, 2002, which is incorporated herein by reference in its entirety.

The invention relates to a method of preparing a design, test and/or development environment for a data processing circuit arrangement, in particular for a digital signal processor (DSP), and system for carrying out such a method.

The preparation of suitable signal processors has emerged as a key to the further development of mobile radio and multimedia information technology. The use of such processors extends from base band processing and media coding through to protocol processing, advance in this field being decisively dependent on the preparation of still more powerful digital signal processors (DSPs) able to satisfy the required high complexity of calculation.

The preparation of suitable design, test, and also development environments here assumes decisive importance. The high complexity of such processors, which may be made up of many millions of circuit elements, is no longer manageable without computer support. In particular, it has turned out that in providing an integrated design and test environment, for example changes in the functions to be provided by the processor, automatically and with computer support, may be taken into account also in the hardware conversion, i.e. in the description of the computer architecture. Furthermore, such a design conversion of the processor also directly influences the software tools used, for example the compiler, the assembler, the de-bugger, the simulator and the profiler, which in a computer-supported design and development environment, can be adapted automatically. Such a complex system is disclosed in WO 00/46704, in which an automatic processor generating system for design of a configurable processor is described. This system can configure a processor automatically by generating a description of a hardware implementation of the processor and a set of software developing tools for programming the processor from the same configuration data, which for example are held in a data bank. This system can be employed to optimize the hardware implementation and the software tools with respect to various output criteria, and moreover permits enlargeability of the processor.

Consideration is now being given to ways of further enhancing the functionality of such a design, test and/or circuit environment for a data processing circuit arrangement.

SUMMARY OF THE INVENTION

Methods and systems for enhancing the functionality of a design, test and/or circuit environment for a data processing circuit arrangement are provided. The methods and systems involve preparing at least one of a design, test and development environment for at least one data processing circuit arrangement, by storing instructions of the circuit arrangement and its binary representations in a data bank in a machine-readable form, and querying information in the data bank automatically in at least one of computer-supported design, test and development runs, wherein the association of a preassigned binary representation with an instruction is capable of being varied.

To achieve a more flexible adaptation of the circuit arrangement to specific applications, it is proposed, according to the invention, that instructions of the circuit arrangement and its binary representations be machine-readably deposited in a data bank, the assignment of a predetermined binary representation (instruction code, i.e. bit code) to a single instruction being laid out variable. This means that instruction and associated binary representation are not fixedly connected to each other. Instead, for example, as required, an instruction and/or a class of instructions may be flexibly assigned binary representations optimized with like command, i.e. instruction codes, to achieve faster execution of the instruction code in a specific application. According to the prior art, this is not possible, since conventionally, a bit code is fixedly connected to an instruction. In the manner according to the invention, processes can be developed at acceptable outlay that are specialized and optimized for working off specific software applications. Furthermore, the elimination of the rigid separation of instruction (command) and associated binary representation, software and hardware permits parallel development for the data processing circuit arrangement. For example, first the instructions can be fixed, so that all tools required for software development, such as assembler, linker, instruction set simulator, etc. can be placed in readiness. In the hardware development, it is then possible to alter the binary representations at any time, and for example with a view to storage requirements, to optimize current consumption of the particular instructions, etc. The hardware development may be carried out parallel to the software development without influencing the latter. Only at the conclusion of both developments, these can be combined by assigning the set of instruction data to the set of binary representations.

On the application side, the invention solves the problem by making available a system for carrying out the method described. This comprises means of storing instructions of the circuit arrangement and their binary representations machine-readably in a data bank, the assignment of a predetermined binary representation (instruction code) to a single instruction being laid out variable, i.e. not rigid.

Advantageous embodiments of the invention are specified in the subsidiary claims.

As already explained above, the degree of optimization of the circuit arrangement can be enhanced if instruction codes are assigned as a function of the specific task, in particular the software program to be worked off, to the current instructions. This is achieved in the invention by a flexible and free assignment of the instructions to the current binary representation, i.e. to the current instruction code. Here, it is to be noted that shorter instruction codes take up less storage room, and as a rule can be executed more quickly. Here, shorter instruction codes can be preassigned for frequently occurring combinations of a command and certain argument values, and longer bit codes for the command with other argument value combinations of less frequent occurrence. The assignment of the binary representations to the instructions (or vice versa) may here be determined according to the invention with computer support, and automatically, in that the software program to be worked off by the circuit arrangement is analyzed respecting the commands used and their arguments. Here, instructions with same command may be assigned instruction codes of different width and deposited in the data bank.

So that the design, test and/or development tools, in particular the various software programs, will remain compatible on the level of the current program source codes (Mnemonics/ Hochsprache) for different circuit arrangements, provision may be made so that a set of instruction data is assigned several sets of binary representations (sets of instruction codes) and deposited in the data bank, adapted in each instance to a specific circuit arrangement. Upon exchange of the data processing circuit arrangement, this may for example be indicated in a corresponding information cell of the data bank. The tools used recognize this, and coordinate the set of instruction data with the corresponding set of instruction codes. Thus, for example the assembler or the compiler can remain unaffected by the changes in the hardware and be used for various processors, without requiring these tools to be newly created.

So that the development tools for the software can be quickly adapted to altered bit codes and/or instructions, a machine-intelligible description thereof may be deposited in the data bank. With conventional data banks, however, this is not feasible. Since the meaning of an instruction is not static, but depends for example on the argument values of the instruction, the machine-intelligible description may advantageously be deposited in the data bank in the form of a function $y=f(x)$. To be sure, according to the invention, it is also feasible to deposit the corresponding y, i.e. the machine-intelligible description of the instruction, in the data bank for every possible argument value x, but this would lead to a very unhandy size of the data bank. However, it is especially advantageous if the functional connection between argument value and bit code of an instruction is fixed and stored, from which the bit code of the instruction can be determined by calculation as a function of the argument value.

It is expedient if, in the data bank, structural components of the switch arrangement including data paths between the structural components are additionally specified. Here, a structural component assigned to an instruction in the data bank, such as for example a register, may be specified, that can be varied in working off the instruction besides the actual result register(s). For example, in an arithmetical operation, a so-called "zero flag" may be set if the result is identically zero. Further, there may be instructions which when worked off overwrite the content of registers systematically, although these registers are not result registers of the instruction. This information can then be used by the design and development tools, which for example automatically optimize a software program that is to be executed on the data processing switch arrangement. This optimization may consist in the parallelization of the execution of instructions. For this purpose, however, it is indispensable that all changes occurring in the processor due to the execution of a single instruction be deposited in the data bank and be available for the optimization described. Thus, it can be prevented that in the working off of the instructions, use data will be unintentionally written over.

To make available the functionalities required for the design, test and/or development environment, such as assembler, disassembler, etc., provision may be made so that the data bank is searched for instructions associated with certain binary representations, or for binary representations associated with certain instructions. Here, these functionalities may be made available by a data bank client interactively controllable and having access to the data bank.

In order specifically to facilitate work with the processor provided, it is proposed, according to the invention, that a programming manual be automatically prepared for the data processing circuit arrangement, computer-supported with querying of information deposited in the data bank by way of the circuit arrangement. Therefore, for the production of the programming manual, use is made of the idea of specifying the circuit arrangement centrally through its set of instruction data, and thence automatically generate the tool, after which changes in the set of instruction data can be made automatically and subsequently taken into account in a new edition of the manual.

To be able to produce programming manuals for a plurality of circuit arrangements, provision may be made so that the programming manual generator used is hardware-independent, and tailor-made for one preassigned hardware architecture only.

To be able to cover the various uses of a programming manual, provision may be made so that it is generated both in a form suitable for picture screen representation and also in a form suitable for print representation. As a rule, a computer-storable file is generated, containing the information of or for the programming manual. According to the invention, therefore, sometimes the programming manual may be equated to such a data file.

So that the user may in particular influence the conformation of the programming manual, provision may be made so that the desired layout can be preselected by the user in the tool for preparing the programming manual, i.e. the programming manual generator.

It is especially advantageous if, in the use of the programming manual, information deposited in the data bank is called up with computer support. Thus, it can be achieved that sometimes the making of changes in the set of instruction data will not necessarily entail a new edition of the programming manual, since the changes are taken into account by direct reference to the data bank in the computer supported use of the programming manual as described. Since the information can be queried at a neutral location, the scope of the actual programming manual is relatively small compared to conventional programming manuals. The advantage of such a reference from programming manual to data bank manifests itself for example in the furnishment of a search function, in the preparation of an index or in the visualization of information for the user. This reference from manual to data bank, or to information in the data bank, may for example be accomplished by pointers. Such a programming manual may be made available in an on-line version advantageously also by the interactively controllable data bank client explained above, who has access to the information deposited in the data bank.

To make available the necessary information for a system of making available a design, test and/or development environment, an instruction of the set of data instructions deposited in the data bank comprises at least one designation, an optimal description associated with the instruction, and a list of the arguments associated with the instruction. Besides, in the set of instruction data, each argument is provided with an associated designation, an optional description, and a range of values associated with the argument. It is especially advantageous if each instruction is additionally assigned a machine-readable description of its functionality, for example in the form of a description in a Hochsprache, which can be processed within the design, test and/or development environment. As already explained above, a binary representation (instruction code) may be included further for each possible instruction, the fixed components, in particular the operating code of the bit code may be designated by a pattern. Further, provision may also be made so that each instruction code comprises the binary representation of all arguments of the command, to describe the variable components of the bit code, so that in principle all possible instruction codes, i.e. a complete set of instruction codes, is deposited in the data bank, on which the further design, test and/or development steps can mount.

BRIEF DESCRIPTION OF THE DRAWINGS

The invention Will be illustrated in the following by a description of some embodiments with reference to the accompanying drawings, in which.

DETAILED DESCRIPTION OF THE INVENTION

The following description relates to a computer-supported environment for designing and testing a digital signal processor, within which programs for the processor can be developed as well. The core of this environment is a data bank from which the various tools such as compiler, assembler, debugger, simulator, profiler etc. are generable automatically. The data bank includes machine-readable information with which the digital signal processor is described completely, Here an interactively controllable data bank client is installed, which accesses the data bank and makes the data bank's information accessible to other parts of the environment or for generating the said tools. For example, assembler and compiler access the data bank through the client to obtain the necessary information for the assembler and/or compiler of a program.

Figures 1, 2:
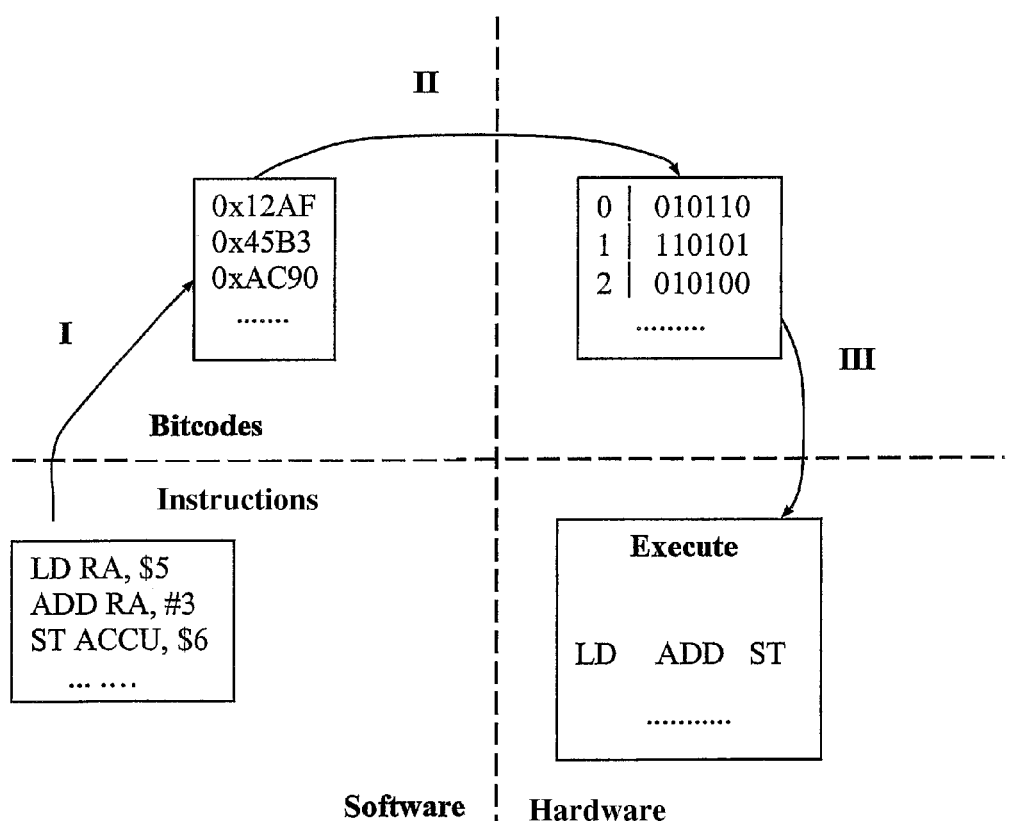
FIG. 1 shows an exemplifying form of storage of two instructions in the data bank, FIG. 2 in a schematic diagram, shows the transformation of the command into the associated instruction codes and their transmission in the processing to execution of the command, FIG. 3 in a block diagram, shows the generation of a programming manual.

Examples of information queriable within the design, test and/or development environment that is deposited in the data bank are shown in FIG. 1 in terms of two instructions, i.e. commands, that are worked off in the ALU (arithmetic logic unit) of the processor. The first instruction is designated as ADD and relates to addition of two register words, see FIG. 1, the number of arguments being specified in the second column. After that, in the next column, comes the specification of the argument or arguments, in the present case the specification of the possible registers RA and RB. Besides, for each instruction a description of its functionality is specified in a C-program code, readily grasped and further processed within the design, test and development environment described. These functionalities are specified in the 'action' column. For the ADD command, this means that the contents of the first specified register (#1) is added to the contents of the second specified register (#2), the result standing in the ALU result register. Each instruction is further linked to at least one binary representation (bit code), also termed an instruction code. This, in the example described, has a length of 20 bits and consists of 3 parts, which in the case of the ADD instruction are termed the ADD Op code, RA code and RB code, the first having the width of 6 bits and the two register codes a width of 7 bits each.

In the second line, a SUB command is specified, that determines a subtraction of the content of register A from register B, a subtraction of register C from a constant c#, or a subtraction of the constant c# from register C. For storage optimization, the instruction SUB, according to operands, comprises a different Op code, the instruction code of the first subtraction having a length of 20 bits, and the instruction codes of the other two subtractions comprising 24 bits, to cover a greater range of values of the constant c#.

Further, in the data bank the binary representations of all arguments of the current command are deposited, to describe the variable components of the bit code. In the example, this is consequently the binary representation of the register A (RA code), the binary representation of the register B (RB code), the binary representation of the register C (RC code) and the binary representation of all possible values of the constant c# (c# code), so that all valid instruction codes are determinable from the information in the data bank.

Further, each argument in the data bank is specified by its designation, a description, and an associated range of values if present.

It may be noted that while in FIG. 1 the instructions are represented together with their binary representations, yet in the data bank, an association of a certain instruction with a certain binary representation is not rigid but freely determined. This means that in particular during the designing and testing of the processor, but also during development of a program for the processor, the binary representation associated with the several instructions may be varied to optimize certain output parameters of the processor, for example to optimize the rate of execution or a compatibility of the tools such as assembler or disassembler in working with various processors as well.

FIG. 2, in a schematic representation, shows the transmission of the instructions (lower left quadrant) in an assembler program to their associated binary representations (bit codes) and their conversion into executable commands in the processor (lower right quadrant). The assembler program is here converted by means of an assembler into a bit code sequence deposited in a data file, as represented by the arrow marked I. This bit code sequence is loaded in the processor by the assembler program as a binary bit code sequence, which is represented by the arrow II. In the processor, the binary bit code sequence is decoded to execute the command in the processor (III). As appears from the representation, the bit codes are employed as medium for transport of the commands from the software (assembler program) into the executing processor. Thus, the bit codes perform an intersecting function between the software and the executing hardware, so that an adaptation of the software to the hardware is performed by way of the bit codes. In order, after working with a first processor, to employ a second processor in the same environment, with the same functional scope, the new association of the binary representations preassigned by the second processor with the instructions, many of the development tools used remain unchanged, since nothing has changed on the level of the program source codes, i.e. for example the assembler and the programming Hochsprache used. Even if, in a conventional environment such tools may in part be produced automatically, the processor exchange involves an additional expenditure of labor in every case owing to the necessary adaptation. According to the invention, however, this can readily be avoided by exchange of the set of binary representations associated with the current processor. The adaptation to the new processor is thus carried out by a new coordination of the instructions with the binary representations of the new processor, a transformation of essential tools of the developing and testing environment.

As already explained, the instruction codes may be so associated with the current instructions as a function of the program to be worked off by the processor that they are worked off time-optimized by the processor. If a certain command is always executed with the same argument within a preassigned program, then this special instruction is assigned an instruction code of short bit length, so that the code will firstly occupy less storage space and secondly be executable more quickly. Another example relates to an addition command, where a target register and the two numbers to be added are specified as arguments. Since in the example, the two numbers often lie within −8 to 7, the programming tool then provides an instruction code of 10 bits. In other cases, where the numbers embrace a greater range of values, a bit code of 20 bits is automatically provided for the same command. Here again, the working off of the program on the digital signal processor is time- and memory-optimized with computer supports.

In a special embodiment of the invention, the information concerning the association of argument values x of an instruction with their bit codes $y_1$ is given by way of a functional relationship $y_1=f_1(x)$. The bit codes may be computed starting from argument values x. In the case of an instruction having several arguments x, z, the bit code $y_2$ is calculated according to a preassigned function $y_2=f_2(x, z)$.

In addition to the content of the data bank as previously described, it also includes data on structural components of the processor, including the data paths between structural components and specification of structural components influenced in the execution of certain instructions. This does not affect source or target registers of an instruction, but for example a flag register, altered owing to the special hardware construction in the execution of the instruction.

Another similar example relates to the instruction "copy," with arguments Register A and Register B. This command is executed by shifting of the contents of Register A into Register B. In the linking of this instruction to the arguments Register A and Register X, then, for execution the contents of Register A should be shifted into Register X. But since in the hardware of the processor used there is no direct connection between the two registers, the conversion of the command must be carried out by way of an intermediate Register C, that can be connected both to Register A and to Register X. The contents of Register A are therefore first transmitted into Register C and then into Register X. On the command level, these distinctions are not visible; the command "copy" is always used. To avoid errors that occur when Register C is simultaneously used also for another instruction running parallel, in the data bank the command "copy" arranges Register C as the structural component to be changed in the execution of the command. This information in the data bank, as has already been explained, is also used in the development of a software program for the digital signal processor for optimized working off of the command, in which the command is at least partly processed parallelwise for time optimization. Owing to the described structure of the data bank, in the program development it can be noted that instructions running off parallel on the processor will not overwrite reciprocally calculation-relevant registers.

Figure 3:
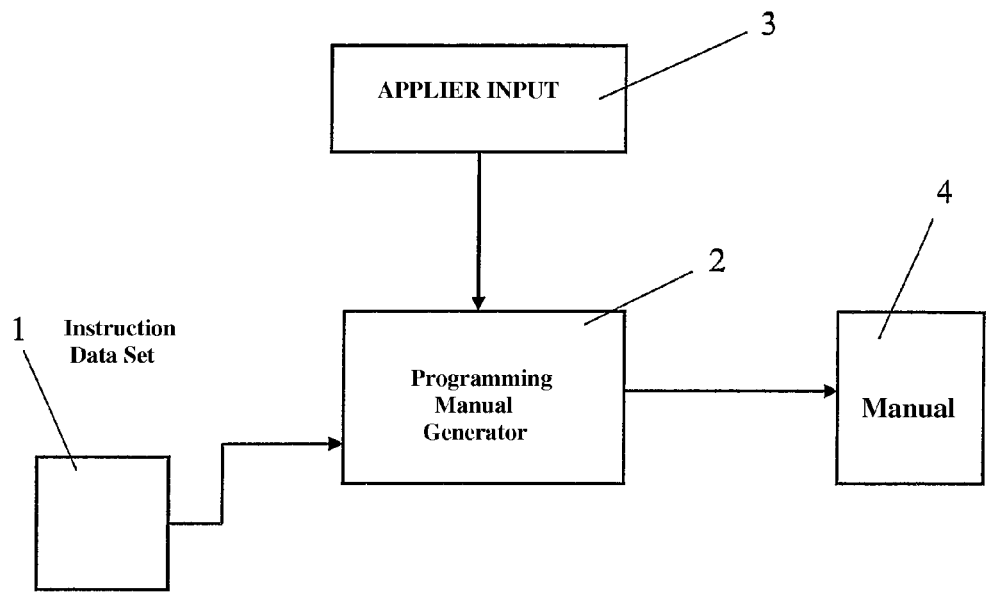

FIG. 3 shows, in a block representation, an excerpt of the design, test and development environment for execution of a method according to the invention for preparing a programming manual for a digital signal processor. An instruction data set of the processor as described is present in the data bank 1 and is computer-supported by a programming manual generator 2, laid out as software, read out, and employed to prepare the manual 4. This programming manual serves as directions for a programmer writing application software for the processor. By an applier input 3, the programming manual generator can be configured. Specifically, it is possible to specify a special layout and the format of the manual. In the present case, an HTLM may be selected as first format, so that the manual 4 prepared can be employed directly for picture screen representation without transformation. For this purpose, the manual generator produces a data file with individual HTLM picture screen pages that can be called up within a likewise integrated software environment. Furthermore, the applier input 3 can also determine that the programming manual generator 2 will generate the manual in a format suitable for print production. In the present instance, then, a "LaTeX-File" is generated, by means of which a programming manual can be produced on paper.

Figure 4:
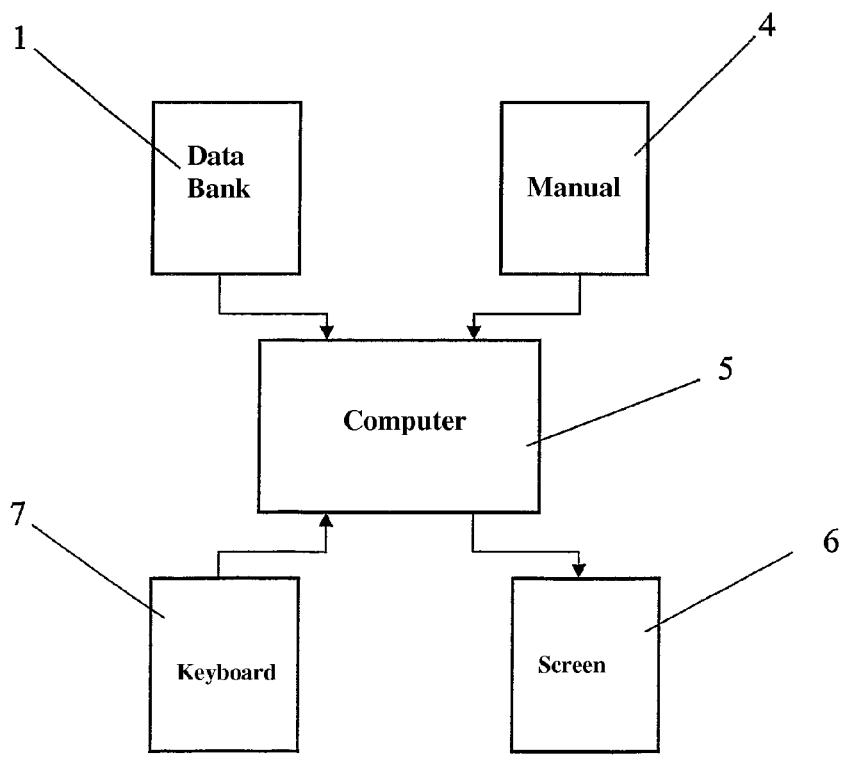
FIG. 4 shows the computer-supported use of the programming manual generated.

In a special embodiment, for the electronic manual, the data bank is accessed by way of the data bank client by means of a pointer with which data can be queried directly from the data bank using the programming manual, so that this information need not be deposited in the manual. This also means that a change in the data bank 1 does not automatically necessitate a new programming manual 4 according to FIG. 3, but sometimes the changed information is taken into account in use of the original manual. FIG. 4, in a schematic sketch, shows the use of such an electronic programming manual 4. On a computer 5, runs a software program likewise made available by the programming manual generator, that employs the manual 4 to represent desired information on a screen 6. For this purpose, the user, on a keyboard 7, can query the desired information from the manual. If this, for example, requires a key word index to the manual, for this purpose the manual contains a reference to preassigned information units read out by the computer 5 from the data bank 1, processed by information technology, and, as desired, indicated as a key word list on the picture screen 6.

The invention claimed is:

1. A method of preparing at least one of a design, test and development environment for at least one data processing circuit arrangement, the method comprising the steps of: storing instructions of the processing circuit arrangement and binary representations of the instructions of the processing circuit arrangement in a data bank in a machine-readable form, and querying information in the data bank automatically in at least one of computer-supported design, test and development runs, wherein the association of a preassigned binary representation with an instruction is capable of being varied
   wherein, in the preparation of a computer program, the data bank is searched for at least one binary representation of a structural component, which is influenced in the execution of a preassigned instruction.

2. The method according to claim 1, wherein the instructions and theft binary representations are stored in the data bank, where for one instruction, a plurality of binary representations, each associated with a specific circuit arrangement, are stored.

3. The method according to claim 1, wherein, in the data bank, a complete instruction data set is stored, for which a plurality of binary representation sets are stored, each associated with a specific circuit arrangement.

4. The method according to claim 1, wherein at least one instruction code, computer-supported, is fixed in response to the command and its arguments in a program to be worked off by the circuit arrangement.

5. The method according to claim 1, wherein for instructions with like command, as a function of their at least one argument, instruction codes of different bit width are stored in the data bank.

6. The method according to claim 1, wherein, for instructions with different command, instruction codes of different bit width are stored in the data bank.

7. The method according to claim 1, wherein the data bank is searched for at least one instruction with which a preassigned binary representation is associated.

8. The method according to claim 1, wherein the data bank is searched for at least one binary representation associated with a preassigned instruction and its argument values.

9. The method according to claim 1, wherein, by way of interactive accesses to the data bank, a search function and a visualization of information on data deposited in the data bank are used for conversion of an electronic programming manual.

10. A method of preparing at least one of a design, test and development environment for at least one data processing circuit arrangement, the method comprising the steps of: storing instructions of the processing circuit arrangement and binary representations of the instructions of the processing circuit arrangement in a data bank in a machine-readable form, and querying information in the data bank automatically in at least one of computer-supported design, test and development runs, wherein the association of a preassigned binary representation with an instruction is capable of being varied, wherein a programming manual is prepared automatically for the data processing circuit arrangement with computer support and querying of information deposited in the data bank, produced in a machine-readable form suitable for picture screen representation or for print production, wherein for the preparation of the programming manual a hardware-dependent programming manual generator tailor-made for a preassigned hardware architecture is employed, at least one programming manual layout predetermined by the user is determinable.

11. A system for preparing at least one of a design, test and development environment for at least one data processing circuit arrangement,
the system comprising:

means for storing instructions of the processing circuit arrangement and binary representations of the instructions of the processing circuit arrangement in a data bank in a machine-readable form; and means for querying information in the data bank automatically in at least one of computer-support design, test and development runs, wherein the association of a preassigned binary representation with an instruction is capable of being varied, wherein descriptions of structural components of the circuit arrangement including data paths between the structural components are deposited in the data bank, where in the data bank, for at least one instruction, at least one structural component associated with the instruction, is specified, which in addition to a result register is influenceable in executing the instruction.

12. The system according to 11, wherein, with an instructions, a title associated with the instruction, a description associated with the instruction and a list of arguments associated with the instruction are stored.

13. The system according to claim 12, wherein, for the instruction, a machine-readable description of its functionality is also stored.

14. The system according to claim 12, wherein, in the data bank, for each argument, a designation associated with the argument,
a description associated with the argument, and
a range of values associated with the argument are stored.

* * * * *

UNITED STATES PATENT AND TRADEMARK OFFICE
CERTIFICATE OF CORRECTION

PATENT NO. : 7,404,153 B2  Page 1 of 1
APPLICATION NO. : 10/503909
DATED : July 22, 2008
INVENTOR(S) : Paul Schwann and Matthias Weiss It is certified that error appears in the above-identified patent and that said Letters Patent is hereby corrected as shown below:

ON THE COVER PAGE:

Item (73) Assignee:

should read -- Philips -- instead of "Phillips"

Signed and Sealed this

Twenty-first Day of October, 2008

JON W. DUDAS
*Director of the United States Patent and Trademark Office*